United States Patent
Feiel et al.

(10) Patent No.: US 9,490,417 B2
(45) Date of Patent: Nov. 8, 2016

(54) METHOD FOR PRODUCING AN ELECTRICAL CONTACT

(71) Applicant: EPCOS AG, Munich (DE)

(72) Inventors: Gernot Feiel, Lieboch (AT); Axel Pecina, St. Martin (AT); Rainer Hoermann, Lieboch (AT); Thomas Goebel, Deutschlandsberg (AT)

(73) Assignee: EPCOS AG, Munich (DE)

( * ) Notice: Subject to any disclaimer, the term of this patent is extended or adjusted under 35 U.S.C. 154(b) by 400 days.

(21) Appl. No.: 13/907,692

(22) Filed: May 31, 2013

(65) Prior Publication Data

US 2013/0255049 A1 Oct. 3, 2013

Related U.S. Application Data

(60) Division of application No. 12/970,590, filed on Dec. 16, 2010, now Pat. No. 8,471,437, which is a continuation of application No. PCT/EP2009/057482, filed on Jun. 16, 2009.

(30) Foreign Application Priority Data

Jun. 19, 2008 (DE) .................. 10 2008 029 185

(51) Int. Cl.
*H01L 41/047* (2006.01)
*H03H 3/02* (2006.01)
(Continued)

(52) U.S. Cl.
CPC .......... *H01L 41/0472* (2013.01); *H01L 41/04* (2013.01); *H01L 41/047* (2013.01); *H01L 41/0533* (2013.01); *H01L 41/083* (2013.01); *H01L 41/25* (2013.01); *H01L 41/293* (2013.01); *H03H 3/02* (2013.01); *H03H 3/04* (2013.01);
(Continued)

(58) Field of Classification Search
CPC . H01L 41/04; H01L 41/047; H01L 41/0472; H01L 41/0533; H01L 41/083; H01L 41/25; H01L 41/293; H03H 3/02; H03H 3/04; H03H 2003/0428; Y10T 29/42; Y10T 29/49005; Y10T 29/49147; Y10T 29/49155
See application file for complete search history.

(56) References Cited

U.S. PATENT DOCUMENTS 5,721,464 A 2/1998 Dibbern et al.
6,008,565 A 12/1999 Inoi et al.
(Continued)

FOREIGN PATENT DOCUMENTS

DE 100 30 742 A1 4/2001
DE 101 21 270 A1 2/2003
(Continued)

*Primary Examiner* — A. Dexter Tugbang
(74) *Attorney, Agent, or Firm* — Slater Matsil, LLP

(57) ABSTRACT

A method for producing an electrical contact is disclosed. In an embodiment the method includes providing a piezoelectric component that includes an electromechanical transducer having two first electrodes and a second electrode arranged between the two first electrodes and spaced from the two first electrodes by a piezoelectric material, the transducer further including a first main side, a second main side opposite from the first main side and a first longitudinal side, and forming a contiguous metallization layer onto a first partial region of the first main side and onto a second partial region along the first longitudinal side, so that the second partial region along the first longitudinal side is at a distance from a side edge facing the second main side and the metallization layer in the second partial region of the first longitudinal side contacts the two first electrodes in an electrically conducting manner.

15 Claims, 3 Drawing Sheets

(51) Int. Cl.
  *H01L 41/04* (2006.01)
  *H03H 3/04* (2006.01)
  *H01L 41/053* (2006.01)
  *H01L 41/083* (2006.01)
  *H01L 41/293* (2013.01)
  *H01L 41/25* (2013.01)

(52) U.S. Cl.
  CPC ........ *H03H 2003/0428* (2013.01); *Y10T 29/42* (2015.01); *Y10T 29/49005* (2015.01); *Y10T 29/49147* (2015.01); *Y10T 29/49155* (2015.01)

(56) References Cited

U.S. PATENT DOCUMENTS

| | | |
|---|---|---|
| 6,346,764 B1 | 2/2002 | Boyd |
| 6,437,488 B1 | 8/2002 | Sube et al. |
| 6,459,048 B1 | 10/2002 | Sakai et al. |
| 6,623,111 B2 | 9/2003 | Nakatani |
| 6,930,438 B2 | 8/2005 | Cramer et al. |
| 7,003,858 B2 | 2/2006 | Sube et al. |
| 7,644,619 B2 | 1/2010 | Koc et al. |
| 2004/0095042 A1 | 5/2004 | Sube et al. |
| 2004/0145276 A1* | 7/2004 | Cramer .................. H01L 41/083 310/328 |
| 2004/0189155 A1 | 9/2004 | Funakubo |
| 2005/0179345 A1* | 8/2005 | Miyoshi .................. Y10T 29/42 |
| 2006/0091766 A1* | 5/2006 | Mochizuki et al. .................... H01L 41/0472 |
| 2007/0120448 A1* | 5/2007 | Miyoshi .............. H01L 41/0472 |
| 2008/0129414 A1* | 6/2008 | Lobl et al. ................ H03H 3/04 |

FOREIGN PATENT DOCUMENTS

| | | |
|---|---|---|
| DE | 10 2006 020 553 A1 | 1/2007 |
| DE | 699 37 222 T2 | 7/2008 |
| EP | 1 006 596 A2 | 6/2000 |
| FR | 2 900 514 A1 | 11/2007 |
| JP | 03-249812 A | 11/1991 |
| JP | 08-222777 A | 8/1996 |
| JP | 11-004026 A | 1/1999 |
| JP | 11097756 A * | 4/1999 |
| JP | 2005-101271 A | 4/2005 |
| JP | 2005-295656 A | 10/2005 |

* cited by examiner

METHOD FOR PRODUCING AN ELECTRICAL CONTACT

This is a divisional application of U.S. application Ser. No. 12/970,590, which was filed on Dec. 16, 2010, which is a continuation of co-pending International Application No. PCT/EP2009/057482, filed Jun. 16, 2009, which designated the United States and was not published in English, and which claims priority to German Application No. 10 2008 029 185.4, filed Jun. 19, 2008, all of which applications are incorporated herein by reference.

TECHNICAL FIELD

The invention relates to a piezoelectric component and to a method for producing a contact, in particular, on a piezoelectric component.

BACKGROUND

Piezoelectric components are known, for example, from the U.S. Pat. No. 6,346,764 B1.

Piezoelectric components of this kind are used in many applications. One typical application is that of actuators, in which a control voltage is used to induce a piezoelectric component to perform vibrations, for example, bending or stretching vibrations. A natural resonant frequency of the piezoelectric component is obtained from the geometric dimensions of the component in conjunction with its elastic properties. These characterize a response of the piezoelectric component to an electrical inducement supplied to the component.

In a typical application, one or more piezoelectric components are used as an actuator, in order to create a piezoelectric motor. By electrical inducement, that is to say the formation of an alternating electric field, the piezoelectric component is induced to perform vibrations, and transmits them to an element that is coupled to it. As a result, for example, a thread makes a motor undergo axial rotation and in this way makes it move.

The elements that are mechanically connected to the piezoelectric component to form an actuator are often electrically conductive. This makes particular demands on the mechanical fastening of the component. For instance, the mounting side of the component should be electrically insulated from the electrical contacting of the electrodes within the piezoelectric component in order to avoid a short-circuit between various piezoelectric components on the construction that is to be created. On the other hand, it should be possible for the individual electrodes within the piezoelectric component to be contacted without great resistance, in order to minimize power losses.

SUMMARY

In one aspect, the present invention provides a piezoelectric component in which sufficiently good contacting is ensured. In another aspect, a method for producing an electrical contact, in particular on a piezoelectric component, is disclosed.

Until now, contacting of a piezoelectric component has been performed by what is known as an immersion process. In this, the component is wetted with a metal layer and the contact is formed in this way. However, the method involves wetting or metalizing all the sides of the component. If some regions, for example, side surfaces, of the piezoelectric component, are not to be metalized, complex measures are necessary to prevent unwanted metallization.

The inventors now propose a piezoelectric component which comprises an electromechanical transducer. This has at least two first electrodes and at least one second electrode, which is arranged between the at least two first electrodes and is kept at a distance from them by a piezoelectric material. Furthermore, the transducer comprises a first main side, a second main side, opposite from the first main side, and a first longitudinal side. The piezoelectric component is distinguished furthermore by a contiguous metallization layer on a first partial region of the first main side and on a partial region of the longitudinal side that is adjacent to the first partial region of the first main side. Here, the partial region of the longitudinal side is at a sufficiently insulating distance from a side edge facing the second main side. Furthermore, this partial region electrically contacts the at least two electrodes.

According to embodiments of the invention, a free border in which there is no metallization, and which consequently permits insulation of the second main side, is formed so as to run along the longitudinal side. The metallization layer applied to the first main side within the first partial region and the partial region of the longitudinal side that is in electrical connection therewith permits the formation of a contact over a large area on the first main side, which contacts the at least two first electrodes in an electrically conducting manner by way of the metallization layer applied to the partial region of the longitudinal side.

The contiguous metallization layer is in this case advantageously sputtered on. The sputtering process may be performed in such a way that the metallization layer is advantageously applied substantially simultaneously both on the first partial region of the first main side and on the partial region of the longitudinal side that is adjacent to the first partial region.

Similarly, the metallization layer may also extend to a partial region on the second longitudinal side, which is arranged opposite from the first longitudinal side. Consequently, the metallization layer can extend to partial regions that are arranged on both sides along the longitudinal side of the piezoelectric component and electrically contact the at least two first electrodes within the piezoelectric component. In both cases, the partial regions along the longitudinal sides are at a distance from the side edge facing the second main side. In other words, the metallization layer along the longitudinal side does not extend completely over the entire width of the longitudinal side but only over a partial region. This partial region is facing the first main side. A border, for example, with a thickness in the range from 2 μm to 14 μm, between the partial region on the longitudinal side and the side edge between the longitudinal side and the second main side, remains free of metallization. This ensures that, when the piezoelectric component is mounted with the second main side on a body, the latter does not lead to an electrical short circuit with the metallization layers located on the longitudinal sides.

In addition, the metallization layer may also extend to a partial region along a third longitudinal side. For example, the third longitudinal side may form the transverse side of the piezoelectric component or of the electromechanical transducer.

To prevent a short-circuit of the at least two electrodes, in a refinement it is envisaged to form them in a partial region of the transducer outside the partial region of the first longitudinal side at a distance from a surface of the first longitudinal side. As a result, the electrodes have smaller dimensions in a partial region of the transducer outside the metallization layer and, in particular, do not reach as far as the surface of the longitudinal side.

In this way it is possible to form a second contiguous metallization layer on a second partial region of the first main side of the transducer and on a partial region of the longitudinal side adjacent to the second partial region. The second metallization layer on the second partial region is correspondingly kept at a distance from the metallization layer on the first partial region. In the same way, the partial regions arranged on the longitudinal side are kept at a distance from one another. Moreover, the partial region of the longitudinal side with the metallization layer is also electrically insulated from the side edge facing the second main side, so that a possible short-circuit with a mounting element arranged on the second main side is avoided.

The second metallization layer on the first main side and the longitudinal side serves the purpose of contacting the at least one second electrode in an electrically conducting manner. At the same time, the second metallization layer is electrically insulated from the at least two first electrodes. This may be performed, for example, by the at least two first electrodes in the partial region of the longitudinal side being adjacent to the second partial region within the transducer and not reaching the surface on the longitudinal side. The same also applies correspondingly to the second electrode in the first partial region and the partial regions of the longitudinal side adjacent thereto.

In this way, two metallization layers that are spaced apart and electrically insulated from one another, with the aid of which the at least two first and at least one second electrode(s) are contacted in an electrically conducting manner, can be formed on the first main side. In a refinement, the metallization layer on the piezoelectric component has a thickness of from 0.3 µm to 5 µm, and in particular a thickness of from 0.5 µm to 2 µm.

In a refinement, the piezoelectric component has a step on the first or second main side. This step may serve the purpose, for example, of permitting mechanical coupling to a mounting element to which a mechanical vibration brought about by the piezoelectric component is to be transmitted. Moreover, further mechanical refinements that are electrically insulated on account of the insulation and the distance from the metallization layer along the longitudinal side or first main side may be carried out on the second main side.

In a refinement, the step on the second main side is arranged in a region which lies outside a projection of the first or second partial region on the first main side.

The metallization layer is sputtered on in the partial region along the longitudinal side and the first main side. This allows the metallization layer to be applied substantially simultaneously on the partial regions of the first and/or second main side or of the longitudinal sides. Moreover, by a suitable offset of the piezoelectric component in relation to the sputtering direction it can be ensured that an electrical resistance of the metallization layer along the side edge between the first main side and the longitudinal side is low and has no effects on the operation and electrical contacting of the electrodes.

In a method for producing contacting areas, in a first step, a piezoelectric component which comprises an electromechanical transducer is provided. This transducer includes at least two first electrodes, between which a second electrode is arranged and is kept at a distance from the first electrodes by a piezoelectric material. The electromechanical transducer consequently comprises a series of alternately arranged electrodes which are enclosed by a piezoelectric material. Furthermore, the transducer has a first main side, a second main side, opposite from the first main side, and a first longitudinal side.

According to embodiments of the invention, sputtering on of a contiguous metallization layer for the contacting of the electrodes is envisaged. The metallization layer is sputtered on, on a partial region of the first main side and on a partial region of the longitudinal side adjacent to the partial region of the first main side.

This is performed in such a way that the metallization layer in the partial region along the longitudinal side does not run completely over the width of the longitudinal side, but instead the metallization layer is at a distance from a side edge facing the second main side. In other words, along the longitudinal side a "free border," which is free from a metallization layer, is formed between the partial region and the side edge facing the second main side. The sputtering material therefore does not get into the region of the free border during the production method.

The metallization layer on the partial region along the first longitudinal side is in electrically conducting contact with the metallization layer on the partial region of the first main side and, moreover, contacts the at least two first electrodes of the electromechanical transducer in an electrically conducting manner.

In a further embodiment, a second contiguous metallization layer is sputtered on, on a second partial region of the first main side that is at a distance from the first partial region of the first main side. Consequently, the first partial region and the second partial region are electrically insulated from one another.

A metallization layer is moreover also sputtered on, on partial regions of the longitudinal side adjacent to the second partial region of the first main side, so that the metallization layer along the longitudinal side and that on the partial region of the first main side are in connection with one another in an electrically conducting manner. The metallization layer on the partial region of the first longitudinal side adjacent to the second partial region contacts the at least one second electrode. Moreover, it does not extend over the complete width of the longitudinal side, but instead a border that is not covered by a metallization layer remains between the partial region along the longitudinal side and the side edge facing the second main side.

BRIEF DESCRIPTION OF THE DRAWINGS

For the remainder, the invention is explained in more detail on the basis of various embodiments with reference to the drawings, in which.

Figure 1A:
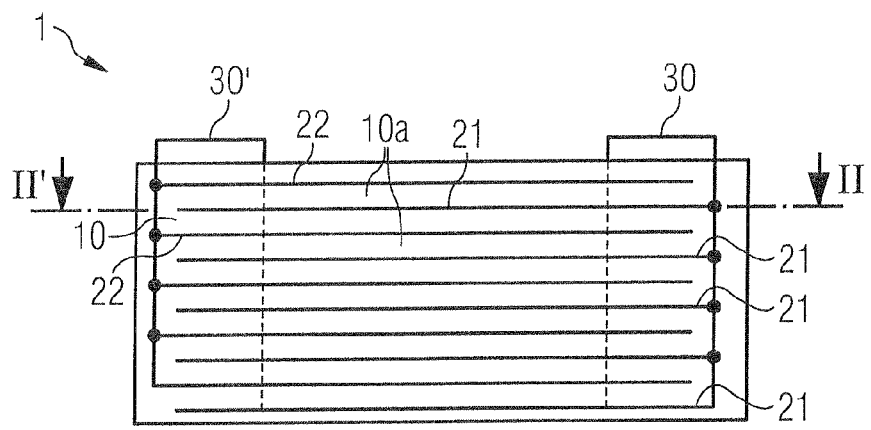
FIG. 1A shows a cross-sectional representation of a piezoelectric component with sputtered-on metallization according to a first embodiment.

The embodiments that are presented and explained in the figures that follow are not drawn with their individual elements to scale. In particular, individual elements may be shown over-large or over-small for more precise illustration. Individual aspects that are only referred to in certain embodiments, for example, layer thicknesses, distances or materials, can be readily transferred to the other embodiments. Components that are the same in terms of effect and function bear the same designations.

The following list of reference symbols may be used in conjunction with the drawings:

1 electromechanical transducer
10a piezoelectric material
10 first main side
11 second main side
12, 13 longitudinal side
14 transverse side
21, 22 electrodes
30, 30' metallization layer
31, 31' first partial region
40, 40', 42 second partial region
51, 52, 53 side edge
D, E distance

DETAILED DESCRIPTION OF ILLUSTRATIVE EMBODIMENTS

FIG. 1A shows a cross-sectional representation of a piezoelectric component with a sputtered-on metallization layer for the contacting of individual electrodes within the electromechanical transducer of the component.

Figure 1B:
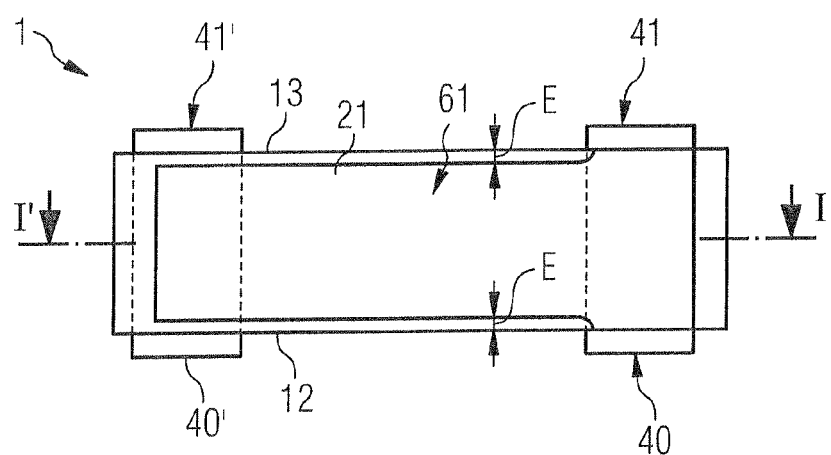
FIG. 1B shows a plan view of the piezoelectric component as shown in FIG. 1A.

The electromechanical transducer 1 comprises a multiplicity of first electrodes 21 and second electrodes 22, arranged one above the other. These electrodes are kept at a distance by a piezoelectric material 10a while forming a sequence of layers arranged such that they alternate one above the other. The respectively outer electrodes are also surrounded by a further layer, so that the electrodes are completely enclosed in the electromechanical transducer 1. For the contacting of the individual electrodes 21 and 22, metallization layers are sputtered on, on the side walls and the first main side 10. The metallization layer 30 is in this case arranged on the side surface in such a way that it electrically contacts the individual first electrodes 21. For this purpose, in the partial region of the longitudinal side of the piezoelectric component in which the metallization layer 30 is located, the first electrodes 21 are led to the surface of the longitudinal side. This structure is represented in FIG. 1B, which shows a plan view of one of the electrodes 21.

In the partial regions 40 and 41 of the longitudinal sides 12 and 13 of the piezoelectric component, the metallization layer 30 is sputtered on. In these partial regions on the longitudinal side, the electrode 21 has a width which corresponds substantially to the width of the transducer 1. In other words, in the partial regions 40 and 41, the electrodes 21 are led to the surface on the longitudinal side of the component and are consequently in conducting connection with the metallization layer in the partial regions 40 and 41.

Outside the partial regions 40 and 41, the electrodes 21 have a slightly smaller width, so that a slight distance E remains between the surface on the longitudinal side of the component and the electrode. The electrodes 21 are consequently surrounded by an insulating material. This ensures that the electrodes 21 do not reach the surface of the longitudinal side 12 or 13 of the component and so possibly cause a short circuit. In particular, the electrode 21 in partial regions 40' and 41' of the longitudinal sides 12 and 13 is electrically insulated from the metallization layer 30' there.

The electrodes 22 in the partial regions 40' and 41' are in turn connected in an electrically conducting manner to the metallization layer 30' applied there. Their form corresponds substantially to the electrodes 21, only they are swapped over and their wide side is on the surface on the longitudinal side in the partial regions 40' and 41', where it contacts the metallization layer.

In this way, the metallization layer 30 on the first main side of the piezoelectric component, represented by the dashed line, contacts the electrodes 21. In a corresponding way, the metallization layer 30' on the first main side of the component contacts the electrodes 22 within the electromechanical transducer by way of the metallization layer on the partial regions 40' and 41' of the longitudinal sides 12 and 13. The region 61 on the first main side of the piezoelectric component is free and not covered by a sputtered-on metallization layer.

Figure 2:
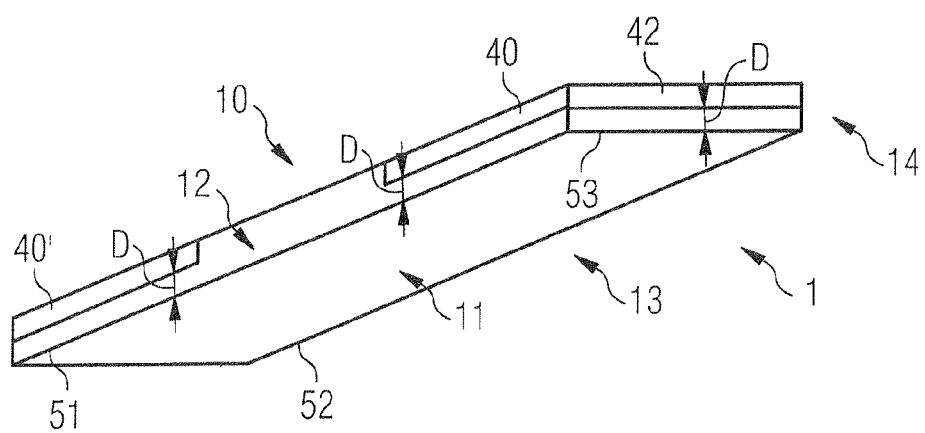
FIG. 2 shows a piezoelectric component according to one embodiment after the sputtering on of the metallization layer in a first perspective view.

FIG. 2 shows a perspective representation of the piezoelectric component on the basis of the proposed principle with the sputtered-on metallization layers for contacting the electrodes within the electromechanical transducer 1. The piezoelectric component comprises the electromechanical transducer 1 with a first main side 10 and a second main side 11, which can be seen here. In the present exemplary embodiment, the second main side 11 is intended to be free from a metallization layer, since it serves as a side for mounting the piezoelectric component. In order to avoid a short circuit, it is therefore necessary to design the contacting and the electrodes within the electromechanical transducer 1 in such a way as to avoid an electrically conducting connection with respect to the second main side 11, and consequently a short circuit.

In this exemplary embodiment, a metallization layer is applied along the longitudinal side 12 in the partial regions 40 and 40'. This metallization layer contacts electrodes within the electromechanical transducer. Moreover, the partial regions 40 and 40' with the metallization layer sputtered on them are kept at a distance from the side edge 51 by way of the distance D. In this way, a free border is formed between the partial regions 40 and 40' and the side edge 51. The side edge 51 accordingly "connects" the longitudinal side 12 to the second main side 13.

Defined on a transverse side 14 of the electromechanical transducer 1 is a further partial region 42, in which the metallization layer is likewise sputtered on. This layer is also kept away from the side edge 53 by way of a free border with the distance D. The free border with the distance D, which lies, for example, in the range from 2 to 14 µm, ensures sufficient insulation of the metallization layers on the partial regions 40, 40' and 42 from the second main side 11.

Furthermore, the electromechanical transducer 1 is configured in such a way that, in the region of the free border, that is to say in the region between the second main side with the side edges 51, 52 and 53 and the respective partial regions 40, 40' and 42, no further electrodes are arranged within the transducer.

Figure 3:
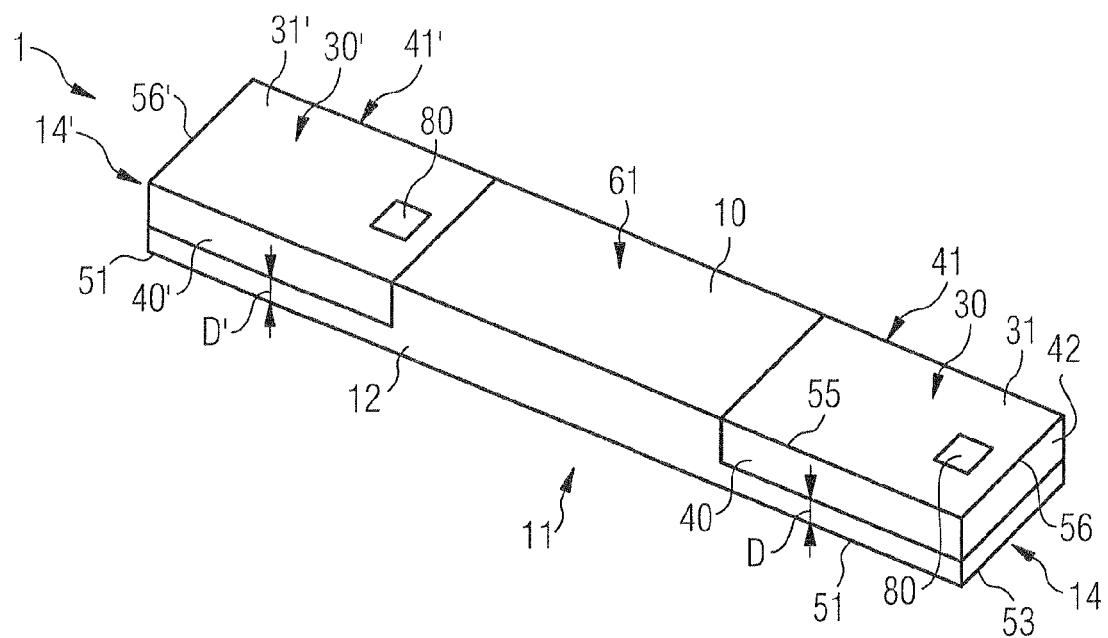
FIG. 3 shows the piezoelectric component as shown in FIG. 2 in a second perspective view.

FIG. 3 shows the piezoelectric component according to FIG. 2 from a second perspective view. The partial regions 40, 40' and 42 arranged on the longitudinal sides are connected in an electrically conducting manner to the metallization layer on the partial regions 31 and 31' of the first main side 10 by way of the side edge 55 on the longitudinal side or the transverse edge 56. Moreover, contacting areas 80 have been applied to the metallization layer 30, 30' of the two partial regions 31 and 31'. With the aid of the contacting areas 80, control signals can be supplied to the electrodes within the electromechanical transducer 1. The connection to the inner electrodes consequently takes place on the longitudinal side of the component by way of an electrically conducting connection to contacts on the upper side 10 of the electromechanical transducer 1. The metallization layer 30, 30' over the side edges 55, 56 and 56' is in this case configured in such a way that it does not have an increased electrical resistance.

Figure 4:
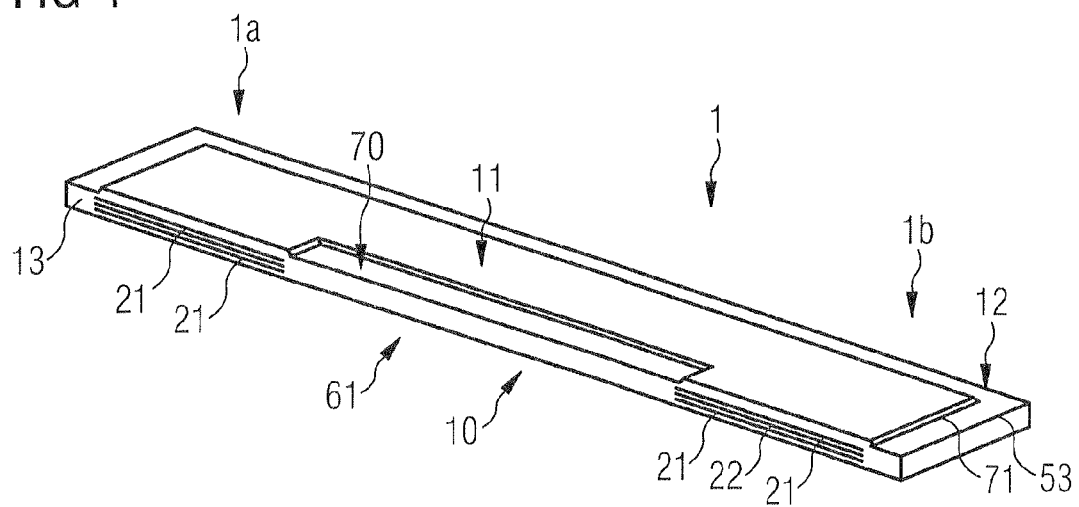
FIG. 4 shows a piezoelectric component according to a first embodiment before the sputtering on of the metallization layer.

FIG. 4 shows a further embodiment of a piezoelectric component in a perspective representation before the sputtering on of the metallization layer. In the case of this embodiment, an additional step 70 has been introduced on the second main side 11, the underside. This step is required by the structural design and serves for the later fastening to a motor that is operated by the piezoelectric component and the electromechanical transducer 1. In the embodiment, the electromechanical transducer comprises two partial regions 1a and 1b, which are kept at a distance from one another by a field-free and electrode-free region 61. In the partial region 61, the step 70 has likewise been introduced on the second main side. In addition, the component has a border surrounding the electromechanical transducer on three sides, so that on the second main side 11 there is an additional step 71 at a distance from the side edge 53.

The partial regions 1a and 1b respectively comprise a multiplicity of electrodes 21 and 22, arranged such that they alternate one above the other and are kept apart by piezoelectric material. In the refinement it is provided that the electrodes 21 are respectively led to the surface of the longitudinal side 13 of the component. By contrast with this, the electrodes 22 are arranged such that they are insulated from the surface of the electromechanical transducer and "floatin"" within the electromechanical transducer 1. An inducement of the electromechanical transducer 1 to produce a vibration consequently takes place by supplying an activating potential to the electrodes 21. As a result, the electromechanical transducer 1 performs vibrations, and in particular bending vibrations.

Figure 5:
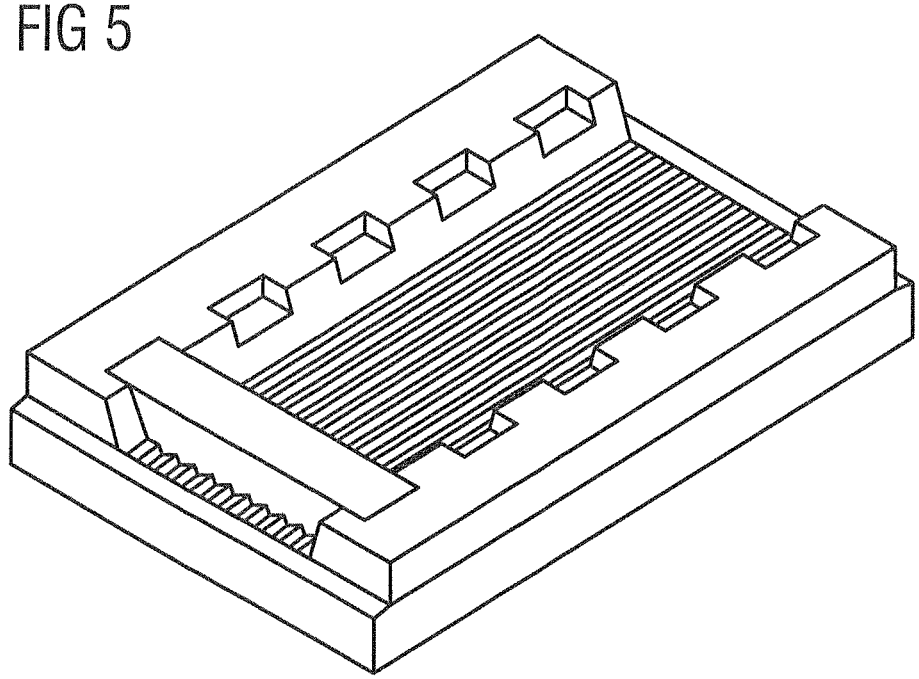
FIG. 5 shows a device for carrying out a sputtering process for piezoelectric components according to the proposed method.

For the contacting of the electrodes 21, the electromechanical transducer 1 is then introduced into a rack, the first main side 10 being arranged at an angle of about 25° to the sputtering direction. A rack of this kind is represented in FIG. 5. Since the step is not to be provided with a metallization, the electromechanical transducer as shown in FIG. 4 is fitted in the rack in such a way that the first main side 10 is facing upward in the sputtering direction.

Subsequently, the metallization layer is sputtered with a thickness in the range from 0.5 μm to 2 μm onto the partial regions 1a and 1b of the first main side 10. On account of the step 70 introduced into the component surface, the component is fitted in a rack in such a way that the first main side 10 is facing upward, to avoid short-circuits in the mounted state during the sputtering. An overlap on the second main side 11, the mounting side of the component, that possibly occurs during the sputtering can in this way be neutralized. The metallization over the longitudinal edge is in this case performed by way of the sputtering rack represented in FIG. 5.

What is claimed is:

1. A method for producing an electrical contact, the method comprising:
providing a piezoelectric component that comprises an electromechanical transducer comprising two first electrodes and a second electrode arranged between the two first electrodes and spaced from the two first electrodes by a piezoelectric material, the transducer further comprising a first main side, a second main side opposite from the first main side and a first longitudinal side; and
forming a contiguous metallization layer onto a first partial region of the first main side and continuously onto a second partial region along the first longitudinal side so that the second partial region along the first longitudinal side is at a distance from a side edge facing the second main side and the contiguous metallization layer in the second partial region of the first longitudinal side contacts the two first electrodes in an electrically conducting manner, wherein the contiguous metallization layer is also continuously formed over a fourth partial region of a second longitudinal side, opposite from the first longitudinal side so that the fourth partial region of the second longitudinal side is at a distance from the side edge facing the second main side and the contiguous metallization layer contacts the two first electrodes.

2. The method as claimed in claim 1, wherein the distance lies in a range between 2 μm and 14 μm.

3. The method as claimed in claim 1, wherein the contiguous metallization layer extends over a side edge between the first partial region of the first main side and the second partial region of the first longitudinal side.

4. The method as claimed in claim 1, wherein a contact on the contiguous metallization layer is applied to the first partial region of the first main side.

5. The method as claimed in claim 1, wherein the transducer further comprises a transverse side adjacent the first and second main sides and adjacent the first longitudinal side, the transverse side comprising a third partial region that is adjacent to the first partial region of the first main side, wherein the contiguous metallization layer is arranged on the third partial region and contacts the two first electrodes in an electrically conducting manner, the third partial region of the transverse side spaced from a side edge facing the second main side.

6. The method as claimed in claim 1, wherein the two first electrodes in a partial region of the transducer outside the second partial region of the first longitudinal side are at a distance from a surface of the first longitudinal side.

7. The method as claimed in claim 6, wherein a second longitudinal side which is arranged opposite from the first longitudinal side, comprises a fourth partial region that is adjacent to the first partial region of the first main side, wherein the contiguous metallization layer is arranged on the fourth partial region and contacts the two first electrodes in an electrically conducting manner, the fourth partial regional of the second longitudinal side spaced from the side edge facing the second main side.

8. The method as claimed in claim 1, further comprising forming a second contiguous metallization layer on a fifth partial region of the first main side of the transducer that is spaced from the first partial region and on a sixth partial region of the first longitudinal side that is adjacent to the second partial region, the first partial region being at a distance from the side edge facing the second main side and the second contiguous metallization layer contacting the second electrode in an electrically conducting manner.

9. The method as claimed in claim 1, wherein forming the contiguous metallization layer comprises sputtering the contiguous metallization layer.

10. The method as claimed in claim 1, wherein the contiguous metallization layer is formed to a thickness of from 0.3 μm to 5 μm.

11. The method as claimed in claim 1, wherein the contiguous metallization layer is formed to a thickness of from 0.5 μm to 2 μm.

12. The method as claimed in claim 1, wherein the component has a step on the first or second main side.

13. The method as claimed in claim 12, wherein the step is arranged in a partial region of the transducer outside the first partial region.

14. The method as claimed in claim 1, wherein the second main side is free from a metallization layer.

15. The method as claimed in claim 1, wherein the two first electrodes and the second electrode are arranged substantially in parallel to the first main side.

* * * * *